United States Patent
Chang et al.

(10) Patent No.: US 11,892,028 B2
(45) Date of Patent: Feb. 6, 2024

(54) FASTENING ASSEMBLY AND BOARD-TO-BOARD ASSEMBLED STRUCTURE

(71) Applicants: LITE-ON ELECTRONICS (GUANGZHOU) LIMITED, Guangzhou (CN); LITE-ON TECHNOLOGY CORPORATION, Taipei (TW)

(72) Inventors: Ching-Chih Chang, Taipei (TW); Pei-Hsuan Huang, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 397 days.

(21) Appl. No.: 17/470,949

(22) Filed: Sep. 9, 2021

(65) Prior Publication Data
US 2022/0186758 A1    Jun. 16, 2022

(30) Foreign Application Priority Data

Dec. 14, 2020  (CN) .......................... 202011472422.0

(51) Int. Cl.
*F16B 5/00*  (2006.01)
*H05K 1/14*  (2006.01)
(Continued)

(52) U.S. Cl.
CPC ................ *F16B 5/00* (2013.01); *B32B 3/266* (2013.01); *B32B 7/08* (2013.01); *H05K 1/144* (2013.01);
(Continued)

(58) Field of Classification Search
CPC .... H05K 1/144; H05K 2201/041; F16B 5/00; B32B 3/266; B32B 7/08
See application file for complete search history.

(56) References Cited

U.S. PATENT DOCUMENTS 4,854,893 A * 8/1989 Morris ................. H01R 9/0521
439/578
5,021,001 A * 6/1991 Ramirez ............ H01R 13/2421
439/578

(Continued)

FOREIGN PATENT DOCUMENTS

TW           M563060 U        7/2018

OTHER PUBLICATIONS

Chinese Office Action corresponding to Application No. 202011472422.0 and dated Mar. 24, 2023, 7 pages.

*Primary Examiner* — Phuong Chi Thi Nguyen
(74) *Attorney, Agent, or Firm* — Innovation Counsel LLP

(57) ABSTRACT

A fastening assembly includes: a first sleeve, a second sleeve, a positioning element, a driven element and an elastic element. The first sleeve includes a plug tube having a passage communicating with the first sleeve. The second sleeve is integrated into the first sleeve. The driven element includes an inserting rod movably inserted in the passage along a first direction and a guiding portion having a first inclined guiding surface forming a first acute angle with the first direction. The positioning element includes a guide rod movably inserted in the second sleeve along the second direction and a slide block connected to the guide rod and in sliding contact with the first inclined guiding surface. One end of the elastic element leans against the driven element, and the other end of the elastic element leans against the first sleeve.

21 Claims, 9 Drawing Sheets

(51) Int. Cl.
 *B32B 7/08* (2019.01)
 *B32B 3/26* (2006.01)
(52) U.S. Cl.
 CPC .... *B32B 2457/08* (2013.01); *H05K 2201/041* (2013.01)

(56) References Cited

U.S. PATENT DOCUMENTS

| | | | | |
|---|---|---|---|---|
| 5,620,339 | A | * | 4/1997 | Gray .................. H01R 9/0518 439/784 |
| 6,475,008 | B1 | * | 11/2002 | Marolda .............. H01R 13/523 439/271 |
| 7,458,851 | B2 | * | 12/2008 | Montena .............. H01R 9/0521 439/584 |

* cited by examiner

FASTENING ASSEMBLY AND BOARD-TO-BOARD ASSEMBLED STRUCTURE

This application claims the benefit of People's Republic of China application Serial No. 202011472422.0, filed Dec. 14, 2020, the subject matter of which is incorporated herein by reference.

BACKGROUND

Technical Field

The invention relates in general to a fastening assembly and an application device thereof, and more particularly to a screw-free fastening assembly and a board-to-board assembled structure applying the same.

Description of the Related Art

With the development of electronic products, such as computer equipment, stereos, VCRs, mobile phones, portable electronic apparatus, etc., the development thereof trends to having more computing power, high speed, and miniaturization. The electronic products must continuously enhance its performance, expand its accessories/equipment, or connect to more external electronic devices in order to meet the needs of users.

A typical industrial computer, for example, usually includes several electronic devices, such as motherboards, hard disks, fan modules, and power supplies, equipped in the case of the industrial computer. These electronic devices traditionally are arranged on a plurality of stacked broads, and these broads are positioned and fixed in the case using screws, plugs or other positioning parts passing through the stacked boards, so that the stacked boards on which the electronic devices fixed can be movably assembled on and/or disassembled from the computer case.

However, the positioning parts, such as screws or plugs, used to position and fix the board (board-to-board) may fall off and lose more likely during the disassembly process, and the disassembled board cannot be re-locked back to the original position. This may cause inconvenience and trouble in the assembly and disassembly of the boards. Furthermore, hand tools (for example, screwdrivers or wrenches, etc.) are required to loosen the screws or plugs when disassembling and assembling theses boards. Different hand tools may be used to drive different screws or plugs. In addition, the work of assembling and disassembling these boards becomes more complicated, time-consuming, and labor-intensive, so that more operational errors are generated.

How to solve the inconveniences and problems in the industry, such as missing of parts and complicated assembly operations due to the need of fixing with many components and requiring to use hand tools during the assembly of the board-to-board connection structure, which may lead to higher manufacturing costs and missing operations, have become the important issues that technicians in this field are eager to study and improve.

SUMMARY

One aspect of the present invention provides a fastening assembly includes: a first sleeve, a second sleeve, a positioning element, a driven element and an elastic element. The first sleeve includes a plug tube connected to a bottom surface of the first sleeve, and the plug tube has a passage communicating with the first sleeve. The second sleeve is integrated into the first sleeve to form an accommodating space communicating with the passage. The driven element is disposed in the accommodating space and includes a guiding portion and an inserting rod, wherein the inserting rod is movably inserted in the passage along a first direction, and the guiding portion has a first inclined guiding surface forming a first acute angle with the first direction. The positioning element includes a guide rod and a slide block, wherein the guide rod is movably inserted in the second sleeve along the second direction that forms a second acute angle with the first inclined guiding surface; the slide block is connected to the guide rod and is in sliding contact with the first inclined guiding surface. The elastic element is disposed in the accommodating space and allowing the inserting rod axially inserted therein, wherein one end of the elastic element leans against the driven element, and the other end of the elastic element leans against the first sleeve.

In one embodiment of the present disclosure, the second sleeve has a first opening and a second opening aligned with each other along the second direction; and the guide rod movably passes through the first opening and the second opening.

In one embodiment of the present disclosure, the positioning element further includes a hook protruding from one end of the guide rod; when the guide rod moves along the second direction to drive the hook out of the first opening, the elastic element pushes the positioning element to make the hook buckled on an upper end of the first opening.

In one embodiment of the present invention, the driven element further includes a base having an upper surface and a lower surface opposite to the upper surface, wherein the inserting rod protrudes from the lower surface, the guiding portion protrudes from the upper surface, and the elastic member leans against the lower surface.

In one embodiment of the present invention, the guiding portion includes a first limiting portion and a second limiting portion both protruding on the upper surface and separated from each other, wherein the first limiting portion has a first vertical wall; the second limiting portion has a second vertical wall facing the first vertical wall; and the guide rod is disposed between the first vertical wall and the second vertical wall.

In one embodiment of the present invention, the first limiting portion includes a first wedge-shaped convex portion protruding from a side opposite to the first vertical wall and the first inclined guiding surface disposed on the first wedge-shaped convex portion. The second limiting portion includes a second wedge-shaped convex portion protruding from a side opposite to the second vertical wall, and the second wedge-shaped convex portion includes a second inclined guiding surface parallel to the first inclined guiding surface.

In one embodiment of the present invention, the slide block further includes a first protruding rib and a second protruding rib, wherein the first protruding rib extends parallel to the guide rod and is in sliding contact with the first inclined guiding surface to make the first limiting portion disposed between the guide rod and the first protruding rib; and the second protruding rib extends parallel to the guide rod and is in contact with the second inclined guiding surface to make the second limiting portion disposed between the guiding rod and the second protruding rib.

In one embodiment of the present invention, the first sleeve has at least one locking hole disposed at a bottom edge of the first sleeve, and the second sleeve has at least one hook protruding from an outer edge of the second sleeve adjacent to its sleeve opening, and correspondingly engaging with the at least one locking hole.

In one embodiment of the present invention, the sum of the first acute angle and the second acute angle is 90°.

Another aspect of the present invention provides a board-to-board assembled structure, wherein the board-to-board assembled structure includes a first board, a second board, and the aforementioned fastening assembly. The first board has a first surface, a second surface opposite to the first surface, and a through hole passing through the first surface and the second surface. The second board faces the second surface and has an insertion hole corresponding to the through hole. A portion of the plug tube in the fastening assembly passes through the through hole from the first surface and is clamped on the second surface. When the positioning element is pushed by the external force to drive the guide rod moving along the second direction in the second sleeve, the driven element is driven to move along the first direction, so as to make the inserting rod passing through the passage and entering into the insertion hole; when the external force is removed, the driven element is pushed by the elastic element to drive the guide rod in the second sleeve moving along a direction opposite to the second direction, so as to make the plunger moving along a direction opposite to the first direction and leaves the insertion hole.

In one embodiment of the present invention, the second board is a movable part that can move along a direction perpendicular to the first direction, and the portion of the inserting rod that enters into the insertion hole is used to stop the second board from moving along the direction.

In one embodiment of the present invention, the first board and the second board are connected to each other through an interference contact between the inserting rod and the insertion hole.

In one embodiment of the present invention, the second surface has a recess for accommodating a portion of the plug tube passing through the through hole.

According to aforementioned embodiments of the present invention, a fastening assembly and a board-to-board assembled structure applying the same are provided. The fastening assembly includes two sleeves used to limit a drive element having an inserting rod. An inclined guiding surface of the driven element can be in sliding contact with a slide block of a positioning element, and the driven element can respond to a lateral moving of the positioning element to drive the inserting rod longitudinally penetrating the sleeve and pass through two corresponding holes of two stacked boards. As a result, these two stacked boards can be joined to each other by the riveting of the inserting rod. In other words, a board-to-board assembly structure can be formed just by pushing the positioning element moving laterally. When disassembling the assembly structure, two stacked boards that are assembled together can be separated just by pushing the positioning element longitudinally away from the buckle to allow an elastic element returning to its original shape. No screw is used for fastening these two stacked boards and no hand tool is needed to loosen the screw. Therefore, the problems of the prior art board-to-board connection technology, such as complicated, time-consuming and labor-intensive assembly and disassembly operations and that can easily lead users to operating errors, can be resolved.

BRIEF DESCRIPTION OF THE DRAWINGS

The above and other aspects of the invention will become better understood with regard to the following detailed description of the preferred but non-limiting embodiment (s). The following description is made with reference to the accompanying drawings

DETAILED DESCRIPTION

The structural and working principle of the present invention will be described in detail below in conjunction with the accompanying drawings:

The embodiments of the present invention provide a fastening assembly and a board-to-board assembly structure to simplify the board-to-board assembly and disassembly operations, reduce working hours and procedures, and prevent users from operating errors. The present invention will now be described more specifically with reference to the following embodiments illustrating the structure and arrangements thereof.

It should be noted that these embodiments are illustrative and for explanatory purposes only, not for limiting the scope of protection of the invention. The invention can be implemented by using other features, elements, methods and parameters. The preferred embodiments are merely for illustrating the technical features of the invention, not for limiting the scope of protection. Anyone skilled in the technology field of the invention will be able to make suitable modifications or changes based on the specification disclosed below without breaching the spirit of the invention. Designations common to the accompanying drawings are used to indicate identical or similar elements.

Figure 1A:
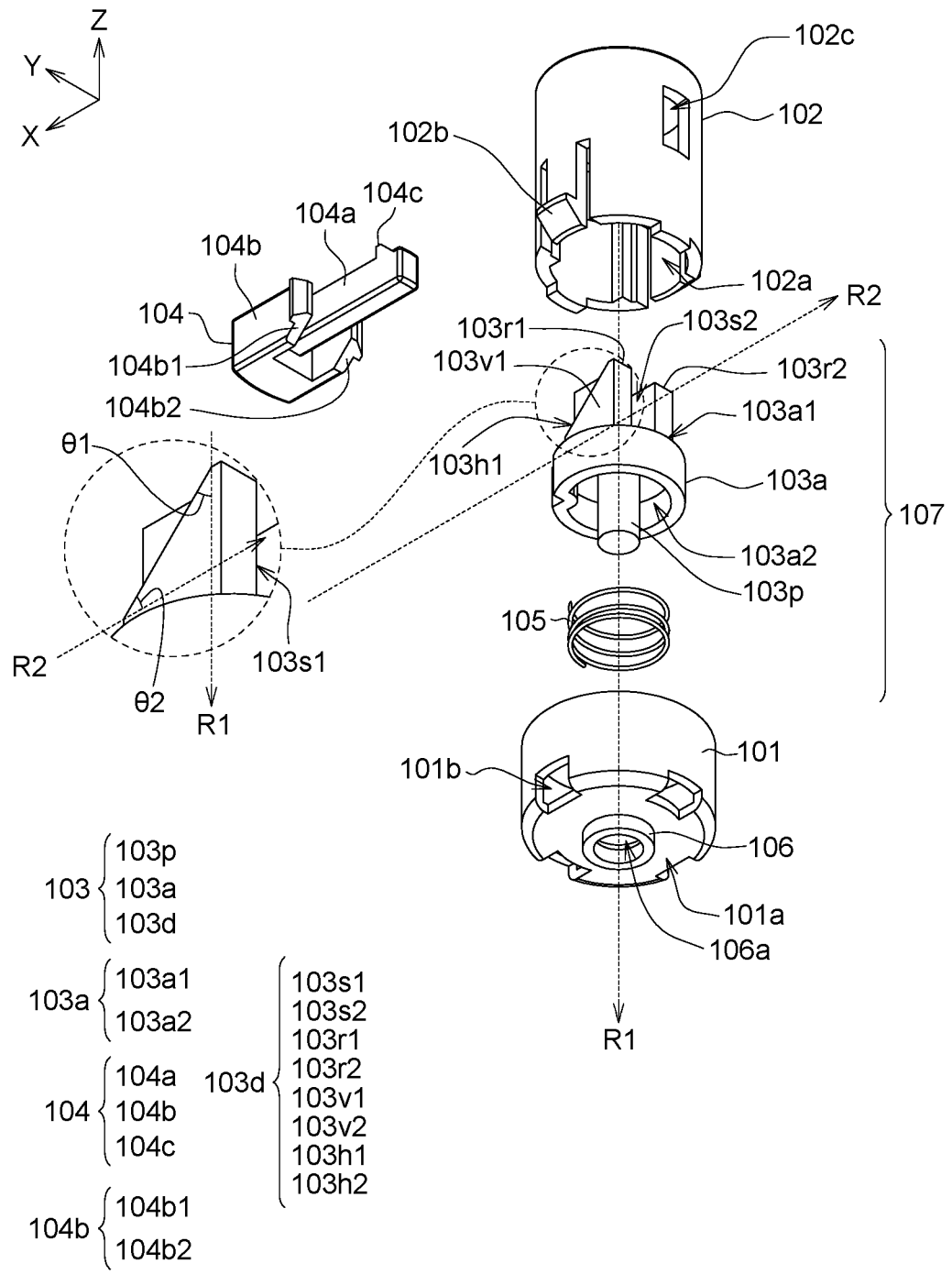
FIG. 1A is a three-dimensional (3D) exploded view illustrating a fastening assembly according to one embodiment of the present invention.
Figure 1B:
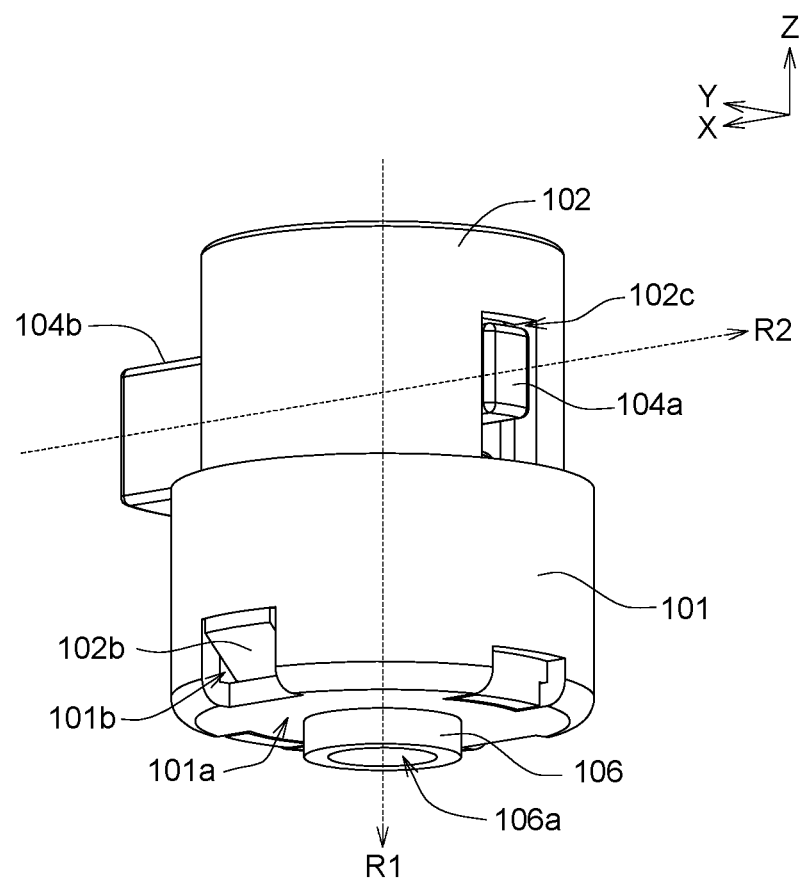
FIG. 1B is a perspective view illustrating the fastening assembly of FIG. 1A drawn along an angle.
Figure 1C:
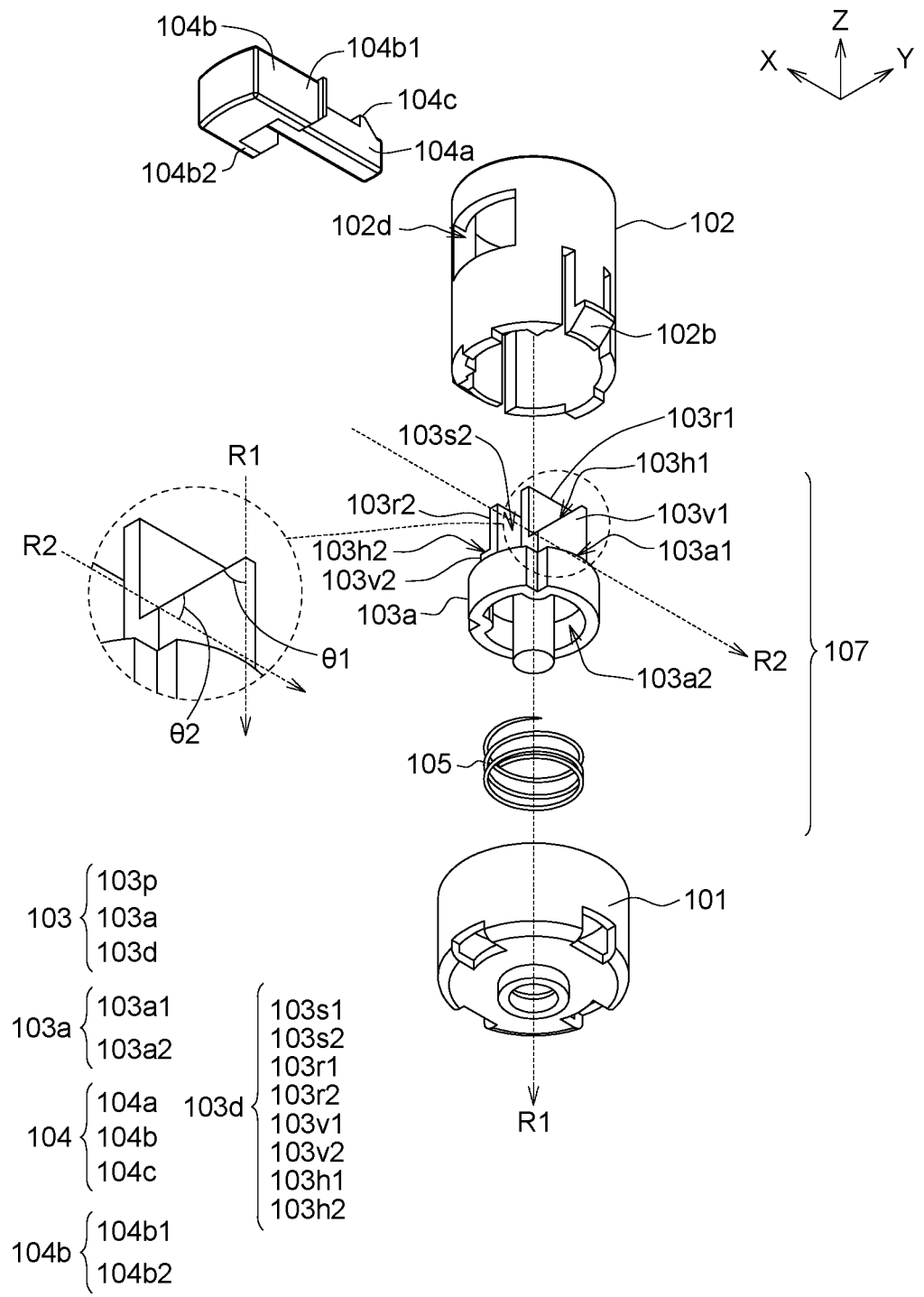
FIG. 1C is another 3D explored view illustrating the fastening assembly drawn along another angle.
Figure 1D:
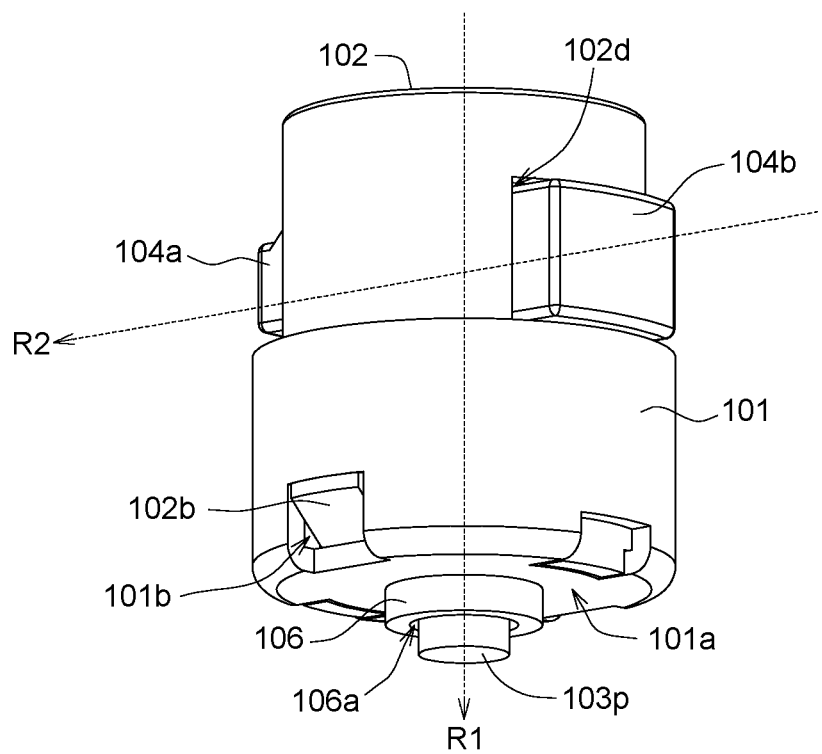
FIG. 1D is another perspective view illustrating the fastening assembly drawn along another angle.

FIG. 1A is an exploded view illustrating a 3D fastening assembly 100 according to one embodiment of the present invention; FIG. 1B is a perspective view illustrating the fastening assembly 100 of FIG. 1A drawn along a certain angle; FIG. 10 is another 3D explored view illustrating the fastening assembly 100, drawn along another angle; and FIG. 1D is another perspective view illustrating the fastening assembly 100, drawn along another angle.

The fastening assembly 100 includes: a first sleeve 101, a second sleeve 102, a driven element 103, a positioning element 104 and an elastic element 105. The first sleeve 101 includes a plug tube 106 connected to a bottom surface 101a of the first sleeve 101, and the plug tube 106 has a passage 106a communicating with the first sleeve 101. The second sleeve 102 is integrated with the first sleeve 101 to form an accommodating space 107 communicating with the passage 106a.

In order to allow the second sleeve 102 to be firmly engage with the first sleeve 101, in some embodiments of the present invention, the first sleeve 101 has at least one (or a plurality of) locking hole 101b disposed at a side wall of the first sleeve 10 adjacent to the bottom surface 101a. The second sleeve 102 has at least one (or a plurality of) hook 102b protruding from an outer edge of the second sleeve 102 adjacent to a sleeve opening 102a, and correspondingly engaging with the at least one locking hole 101b. The second sleeve 102 further has a first opening 102c and a second opening 102d aligned with each other, and the openings allow the positioning element 104 to movably pass through the first opening 102c and the second opening 102d.

The driven element 103 is disposed in the accommodating space 107. In some embodiments of the present invention, the driven element 103 includes a base 103a, a guiding portion 103d, and an inserting rod 103p, wherein the base 103a has an upper surface 103a1 and a lower surface 103a2 on the opposite side of the base 103a. The inserting rod 103p protrudes from the lower surface 103a2, and the guiding portion 103d protrudes from the upper surface 103a1. In the present embodiment, the base 103a includes a circular platform, and the inserting rod 103p is a cylindrical column extending downward from the lower surface 103a2 of the base 103a. A portion of the base 103a is movably inserted into the plug tube 106 along a first direction R1 and passes through the passage 106a.

The guiding portion 103d includes a first limiting portion 103r1 and a second limiting portion 103r2. The limiting portions 103r1, 103r2 are both protruded from the upper surface 103a1 of the base 103a and separated from each other, wherein the first limiting portion 103r1 has a first vertical wall 103s1, and the second limiting portion 103r2 has a second vertical wall 103s2 facing and parallel to the first vertical wall 103s1.

The first limiting portion 103r1 includes a first wedge-shaped convex portion 103v1 protruding from a side opposite to the first vertical wall 103s1 and the first wedge-shaped convex portion 103v1 has a first inclined guiding surface 103h1 disposed thereon. The second limiting portion 103r2 includes a second wedge-shaped convex portion 103v2 protruding from a side opposite to the second vertical wall 103s2, and the wedge-shaped convex portion 103v2 includes a second inclined guiding surface 103h2 parallel to the first inclined guiding surface 103h1, wherein the first inclined guiding surface 103h1 and the second inclined guiding surface 103h2 respectively form a first acute angle θ1 with the first direction R1. In the present embodiment, the first direction R1 is the direction parallel to the Z axis.

The elastic element 105 is disposed in the accommodating space 107, wherein one end of the elastic element 105 leans against the driven element 103, and the other end of the elastic element 105 leans against the first sleeve 101. In some embodiments of the present invention, the elastic element 105 may be an elastic spring that allows the inserting rod 103p axially inserted therein. That means, the inserting rod 103p is inserted into one end of the elastic spring. Such that, the inserting rod 103p is radially surrounded by the elastic element 5. One end of the spring leans against the lower surface 103a2 of the base 103a of the driven element 103, and the other end of the spring leans against the bottom surface 101a (not shown) of the first sleeve 101.

The positioning element 104 includes a guide rod 104a and a slide block 104b connected with each other, wherein the guide rod 104a is movably inserted in the second sleeve 102 along a second direction R2 that forms a second acute angle θ2 with the first inclined guiding surface 103h1 and with the second inclined guiding surface 103h2 respectively. In detailed, the guide rod 104a disposed between the first vertical wall 103s1 and the second vertical wall 103s2 and movably passing through the first opening 102c and the second opening 102d. In the present embodiment, the second direction R2 is perpendicular to the first direction R1, and a sum of the first acute angle θ1 and the second acute angle θ2 is 90°.

The slide block 104b includes a first protruding rib 104b1 and a second protruding rib 104b2, wherein the first protruding rib 104b1 extends parallel to the guide rod 104a and is in sliding contact with the first inclined guiding surface 103h1 to make the first limiting portion 103r1 disposed between the guide rod 104a and the first protruding rib 104b1. The second protruding rib 104b2 extends parallel to the guide rod 104a and is in contact with the second inclined guiding surface 103h2 to make the second limiting portion 103r2 disposed between the guiding rod 104a and the second protruding rib 104b2.

Figure 2A:
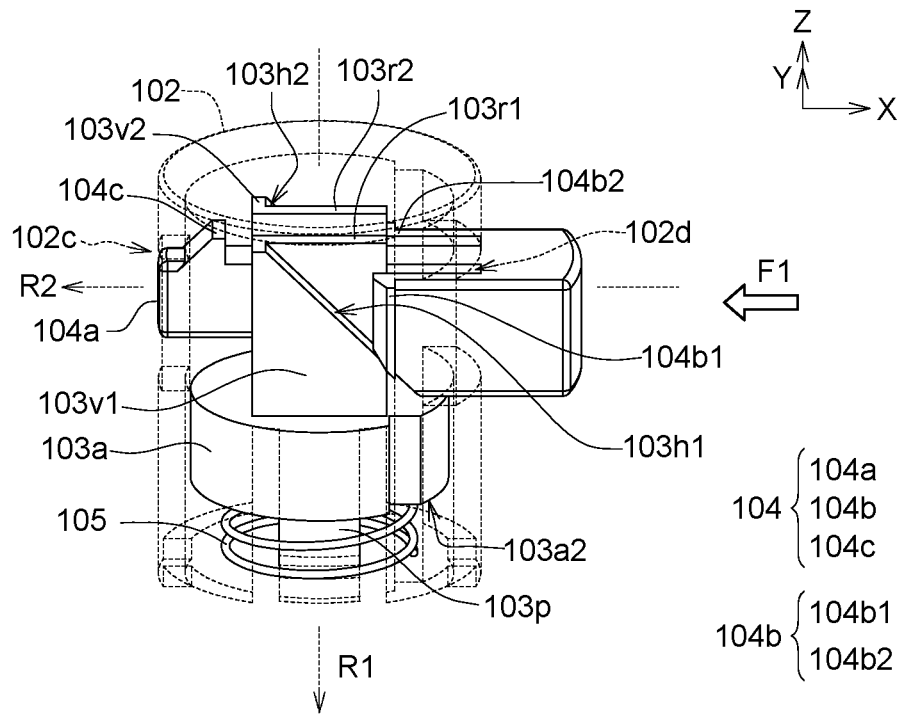
FIGS. 2A to 2C are perspective views illustrating the partial 3D operating structures of the fastening assembly which respectively shows locking and releasing functions.
Figure 2B:
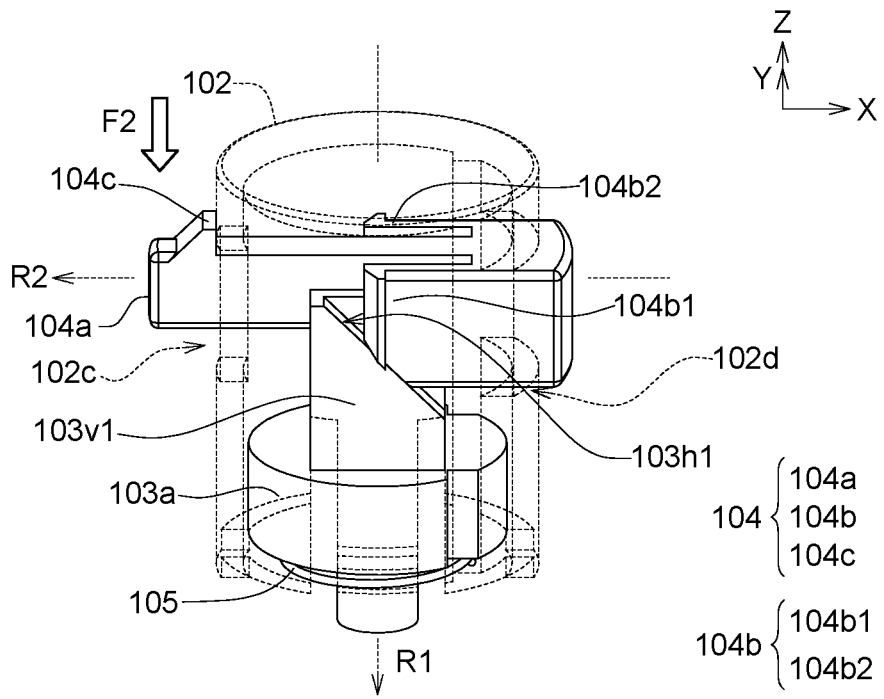
Figure 2C:
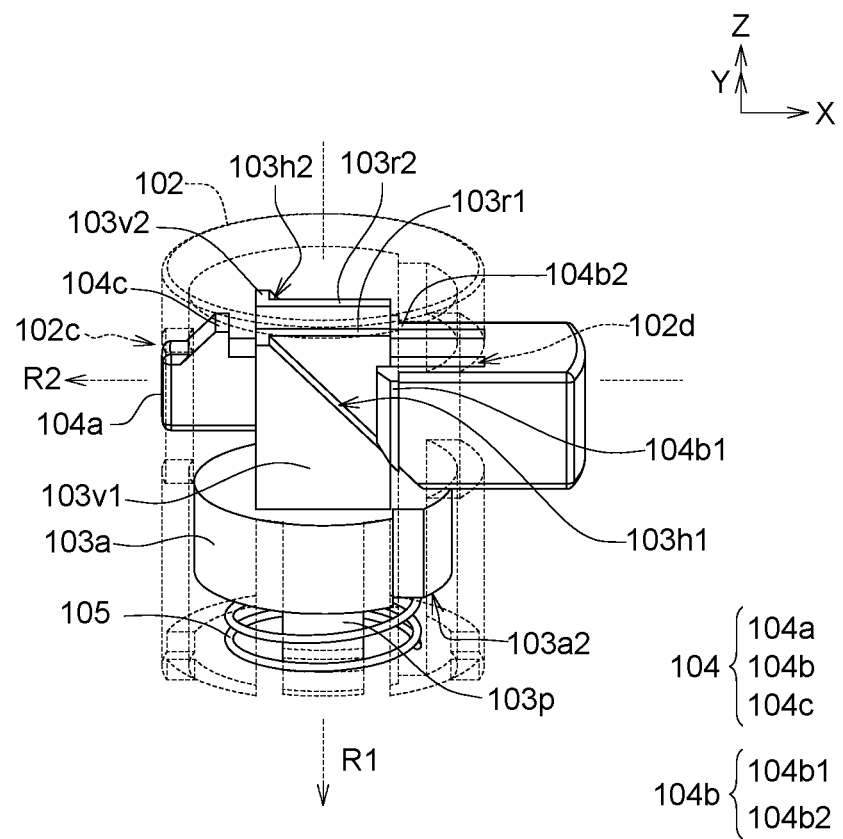

The operation mode between the driven element 103 and the positioning element 104 are shown in FIGS. 2A to 2C. FIGS. 2A to 2C are perspective views illustrating the partial 3D operating structures of the fastening assembly 100 respectively provide locking and releasing functions, according to one embodiment of the present invention. For the purpose of description clarity, the first sleeve 101 is not shown, and the second sleeve 102 is shown in dashed lines. As shown in FIG. 2A, when the positioning element 104 is pushed by an external force F1 to drive the guide rod 104a moving along the second direction R2 in the second sleeve 102, the first protruding rib 104b1 and the second protruding rib 104b2 of the slide block 104b respectively press the first inclined guiding surface 103h1 and the second inclined guiding surface 103h2 of the driven element 103 to drive driven element 103 moving along the first direction R1. When the first protruding rib 104b1 and the second protruding rib 104b2 of the slide block 104b slide to the tops of the first inclined guiding surface 103h1 and the second inclined guiding surface 103h2 of the driven element 103, the inserting rod 103p can pass through the passage 106a and protrudes out of the first sleeve 101 (not shown). At the same time, the elastic element 105 (such as a spring) that is sandwiched between the lower surface 103a2 of the base 103a of the driven element 103 and the bottom surface 101a (not shown) of the first sleeve 101 can be compressed and shorten by the driven element 103; and the elastic potential energy can be stored by the shorten spring.

As shown in FIG. 2B, the positioning element 104 further includes a hook 104c protruding from the end of the guide rod 104a away from the slide block 104b. When the guide rod 104a moves along the second direction R2 to move the hook 104c out of the first opening 102c, the elastic element 105 pushes the positioning element 104 to make the guide rod 104a being slightly lifted in a direction opposite to the first direction R1, so that the hook 104c can be buckled on an upper end of the first opening 102c of the second sleeve 102. Meanwhile, the slide block 104b at least partially enters into the second sleeve 102 and leans against a stop portion (not shown) of the second opening 102d of the second sleeve 102, so that the positioning element 104 and the driven element 103 does not move, relative to each other.

When the external force F1 is removed, another external force F2 parallel to the first direction R1 is required to push the hook 104c of the positioning element 104 away from the upper end of the first opening 102c of the second sleeve 102. As shown in FIG. 2C, at this time, the driven element 103 can be pushed by the elastic element 105, and the first protruding rib 104b1 and the second protruding rib 104b2 can be pressed by the driven element 103 to drive the guide rod 104a moving along the direction opposite to the second direction R2 in the second sleeve 102, until returning to the original position as depicted in FIG. 2A. The inserting rod 103p of the driven element 103 is moved along the direction opposite to the first direction R1 and retracted into the first sleeve 101 through the passage 106a of the plug tube 106, and therefore the elastic member 105 returns to its original length.

Figure 3A:
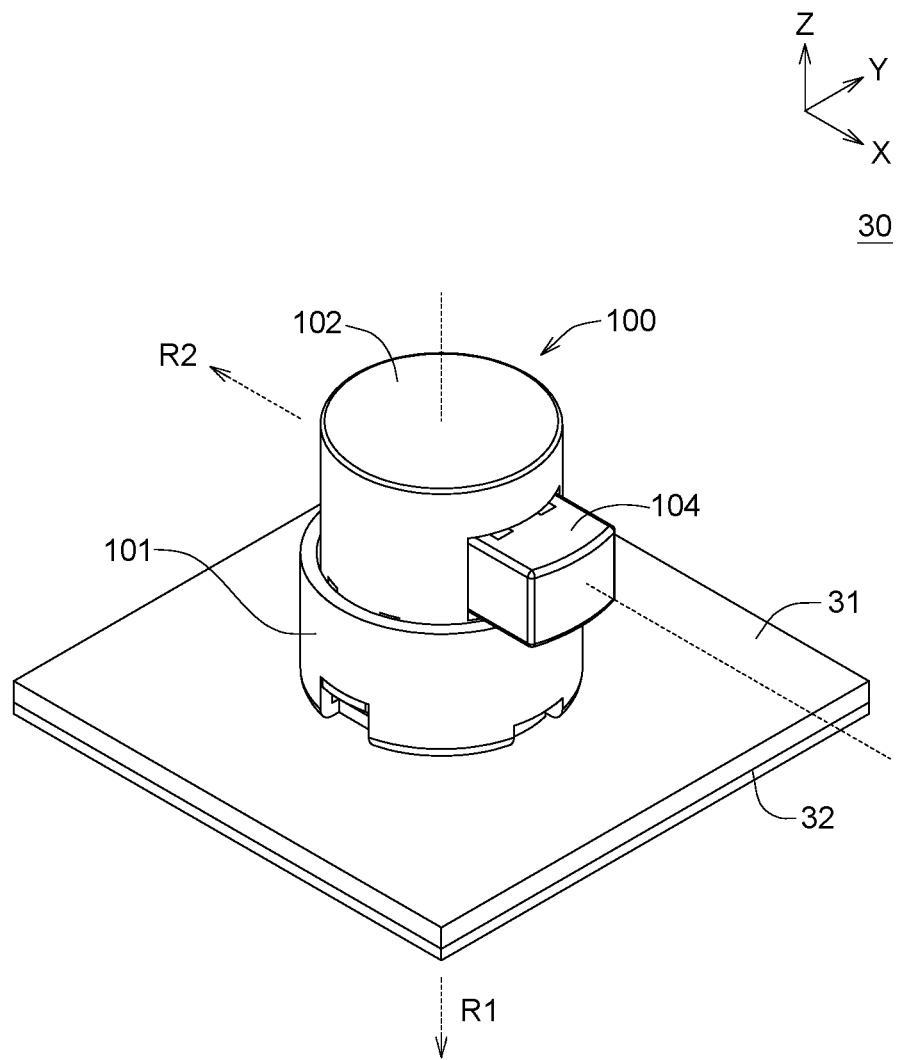
FIG. 3A is an exploded view illustrating a 3D board-to-board assembled structure according to one embodiment of the present invention.
Figure 3B:
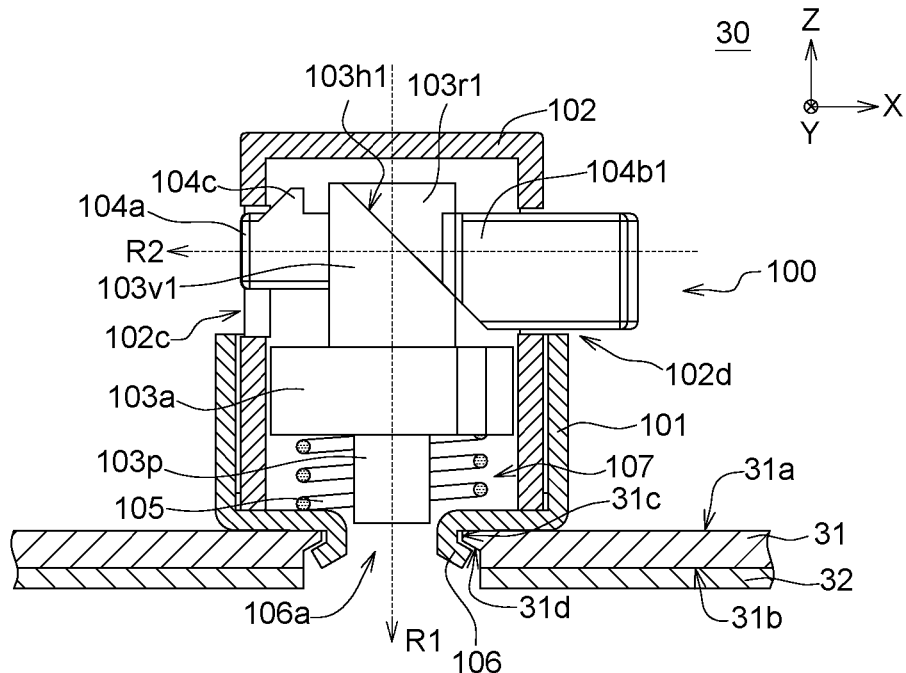
FIGS. 3B to 3C are cross-sectional views illustrating the processing structures for performing a board-to-board connection process.
Figure 3C:
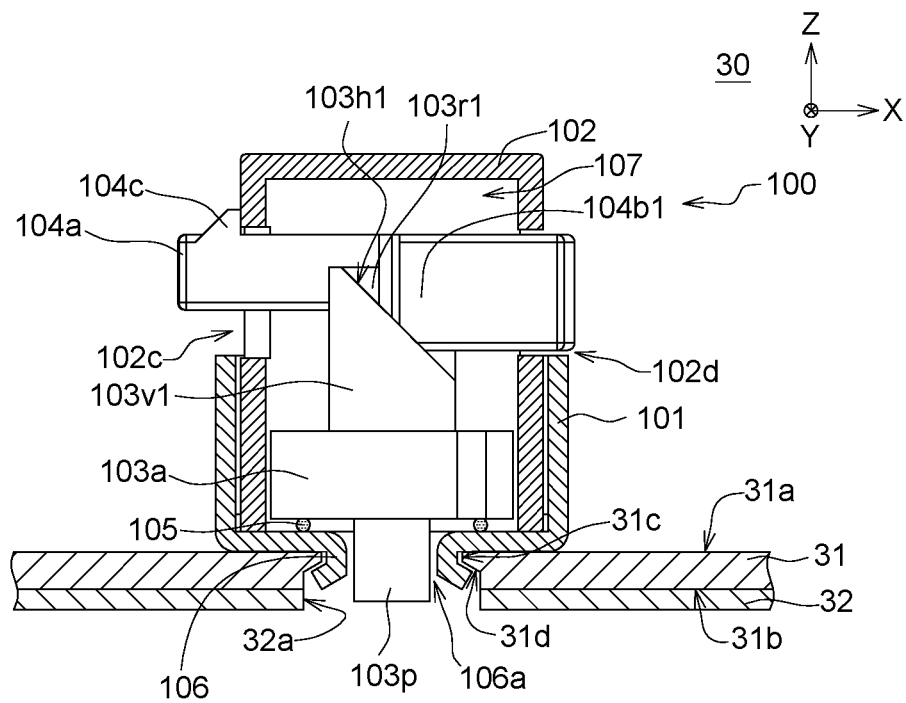

The aforementioned fastening assembly 100 can be applied to a board-to-board connection to form a board-to-board assembly structure 30. FIG. 3A is an exploded view illustrating the 3D board-to-board assembled structure 30 according to one embodiment of the present invention. FIGS. 3B to 3C are cross-sectional views illustrating the processing structures for performing a board-to-board connection process. Wherein the board-to-board assembly structure 30 includes a first board 31, a second board 32, and the fastening assembly 100 as described above. In some embodiments of the present invention, the first board 31 and the second board 32 may serve as a portion of a case of an electronic product or panels positioned and fixed by stacking. The boards 31, 32 are movably assembled and disassembled inside the case of the electronic product to fix electronic devices, such as motherboards, hard disks, fan modules and power supplies.

The first board 31 has a first surface 31a, a second surface 31b opposite to the first surface 31a, and a through hole 31c passing through the first surface 31a and the second surface 31b. The second board 32 faces the second surface 31b and has an insertion hole 32a corresponding to the through hole 31c. The driven element 103 of the fastening assembly 100 can respond to a lateral moving (along the second direction R2) of the positioning element 104 to drive the inserting rod 103p longitudinally (along the first direction R1) penetrating the first sleeve 101 and pass through the two corresponding holes (i.e. the through hole 31c and the insertion hole 32a) of the two stacked boards 31 and 32. As a result, these two stacked boards 31 and 32 can be joined to each other by the riveting of the inserting rod 103p.

In detailed, the assembling and fastening of the board-to-board assembly structure 30 includes the following steps. Firstly, a portion of the plug tube 106 in the fastening assembly 100 passes through the through hole 31c from the first surface 31a and is clamped on the second surface 31b of the first board 31. The plug tube 106 can be made of an elastic material, such as plastic, allowing a portion of the plug tube 106 passing through the through hole 31c to generate an elastic limit ring on the second surface 31b to fix the other portion of the fastening assembly 100 on the first surface 31a of the first board 31. In the present embodiment, the second surface 31b has a tapered recess 31d which communicates with the through hole 31c. In other words, the through hole 31c may have a tapered cross-sectional profile, and the diameter of the through hole 31c gradually increases from the first surface 31a to the second surface 31b, so as to accommodate the portion of the plug tube 106 passing through the through hole 31c.

The positioning element 104 is pushed by an external force F1 to drive the guide rod 104a moving along the second direction R2 in the second sleeve 102, the first protruding rib 104b1 and the second protruding rib 104b2 of the slide block 104b respectively press the first inclined guiding surface 103h1 and the second inclined guiding surface 103h2 of the driven element 103 to drive driven element 103 moving along the first direction R1. Therefore, the inserting rod 103p can pass through the passage 106a and protrudes out of the first sleeve 101 (not shown) and enters into the insertion hole 32a of the second board 32.

In one embodiment of the present invention, the second board 32 can be a movable part. For example, in the present embodiment, the second board 32 can be a plate that uses a sliding groove (not shown) to move along a direction perpendicular to the first direction R1. When the first board 31 and the second board 32 are assembled by a board-to-board connection with the fastening assembly 100, and the inserting rod 103p that enters into the insertion hole 32a can be used to stop the second board 32 from laterally moving (along the direction parallel to the X axil or the Y axil), so as to make the stacked boards 31 and 32 no longer moving relatively with each other.

Figure 4:
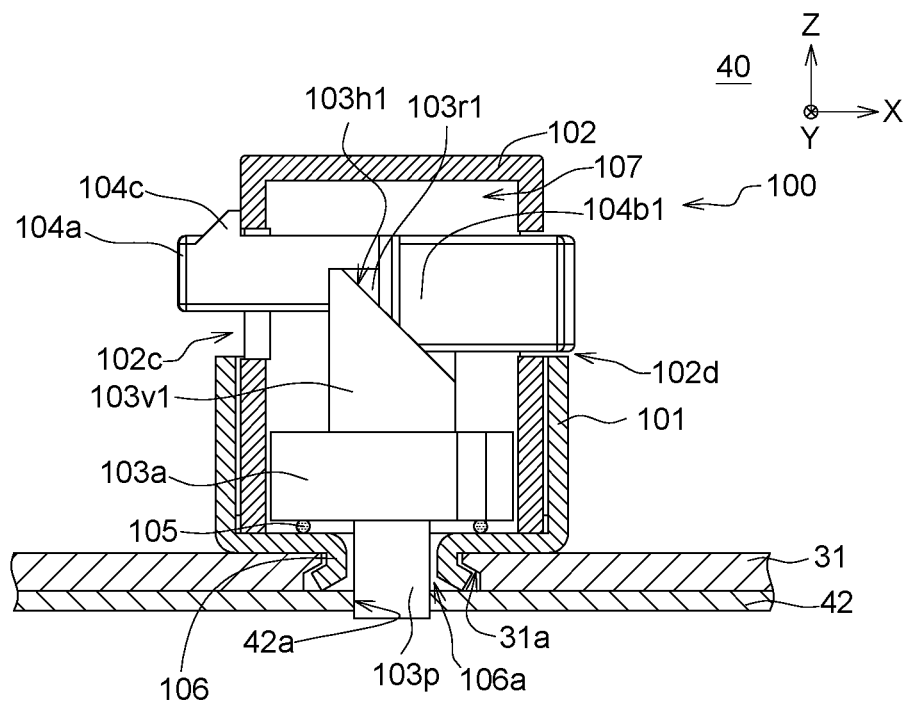
FIG. 4 is a cross-sectional view illustrating a board-to-board assembly structure according to another embodiment of the present invention.

FIG. 4 is a cross-sectional view illustrating a board-to-board assembly structure 40 according to another embodiment of the present disclosure. The first board 31 and the second board 42 of the board-to-board assembly structure 40 are integrated to each other through an interference contact between the inserting rod 103p and the insertion hole 42a of the second board 42 such that the first board 31 and the second board 42 can be joined to each other by the riveting of the inserting rod 103p (as shown in FIG. 4).

According to aforementioned embodiments of the present invention, a fastening assembly and a board-to-board assembled structure applying the same are provided. The fastening assembly includes two sleeves used to limit a drive element having an inserting rod. An inclined guiding surface of the driven element can be in sliding contact with a slide block of a positioning element, and the driven element can respond to a lateral moving of the positioning element to drive the inserting rod longitudinally penetrating the sleeve and pass through two corresponding holes of two stacked boards. As a result, these two stacked boards can be joined to each other by the riveting of the inserting rod. In other words, a board-to-board assembly structure can be formed just by pushing the positioning element moving laterally. When disassembling the assembly structure, two stacked boards that are assembled together can be separated by pushing the positioning element longitudinally away from the buckle to allow an elastic element returning to its original shape. No screw is used for fastening these two stacked boards and no hand tool is needed to loosen the screw. Therefore, the problems of the prior art board-to-board connection technology, such as complicated, time-consuming and labor-intensive assembly and disassembly operation errors, can be resolved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fastening assembly, comprising:
   a first sleeve, comprising a plug tube connected to a bottom surface of the first sleeve, wherein the plug tube has a passage communicating with the first sleeve;
   a second sleeve, integrated into the first sleeve to form an accommodating space communicating with the passage;
   a driven element, disposed in the accommodating space and comprising a guiding portion and an inserting rod, wherein the inserting rod is movably inserted in the passage along a first direction, and the guiding portion has a first inclined guiding surface forming a first acute angle with the first direction;

a positioning element, comprising:
  a guide rod, movably inserted in the second sleeve along a second direction that forms a second acute angle with the first inclined guiding surface; and
  a slide block, connected to the guide rod and in sliding contact with the first inclined guiding surface; and an elastic element, disposed in the accommodating space and allowing the inserting rod axially inserted therein, wherein one end of the elastic element leans against the driven element, and the other end of the elastic element leans against the first sleeve.

2. The fastening assembly according to claim 1, wherein the second sleeve has a first opening and a second opening aligned with each other along the second direction; and the guide rod movably passes through the first opening and the second opening.

3. The fastening assembly according to claim 2, wherein the positioning element further comprises a hook protruding from one end of the guide rod; when the guide rod moves along the second direction to drive the hook out of the first opening, the elastic element pushes the positioning element to make the hook buckled on an upper end of the first opening.

4. The fastening assembly according to claim 1, wherein the first sleeve has at least one locking hole disposed at a bottom edge of the first sleeve, and the second sleeve has at least one hook protruding from an outer edge of the second sleeve adjacent to its sleeve opening, and correspondingly engaging with the at least one locking hole.

5. The fastening assembly according to claim 1, wherein a sum of the first acute angle and the second acute angle is 90°.

6. The fastening assembly according to claim 1, wherein the driven element further comprises a base having an upper surface and a lower surface opposite to the upper surface; the inserting rod protrudes from the lower surface; the guiding portion protrudes from the upper surface; and the elastic member leans against the lower surface.

7. The fastening assembly according to claim 4, wherein the guiding portion comprises a first limiting portion and a second limiting portion both protruding on the upper surface and separated from each other; the first limiting portion has a first vertical wall; the second limiting portion has a second vertical wall facing the first vertical wall; and the guide rod is disposed between the first vertical wall and the second vertical wall.

8. The fastening assembly according to claim 5, wherein the first limiting portion comprises a first wedge-shaped convex portion protruding from a side opposite to the first vertical wall and the first inclined guiding surface disposed on the first wedge-shaped convex portion; and the second limiting portion comprises a second wedge-shaped convex portion protruding from a side opposite to the second vertical wall and comprising a second inclined guiding surface parallel to the first inclined guiding surface.

9. The fastening assembly according to claim 6, wherein the slide block further comprises:
  a first protruding rib, extending parallel to the guide rod and in sliding contact with the first inclined guiding surface to dispose the first limiting portion between the guide rod and the first protruding rib; and
  a second protruding rib, extending parallel to the guide rod and in contact with the second inclined guiding surface to dispose the second limiting portion between the guiding rod and the second protruding rib.

10. A board-to-board assembled structure comprising:
a first board, having a first surface, a second surface opposite to the first surface and a through hole passing through the first surface and the second surface;
a second board, facing the second surface of the first board and having an insertion hole corresponding to the through hole; and
a fastening assembly, comprising:
  a first sleeve, comprising a plug tube connected to a bottom surface of the first sleeve, wherein the plug tube has a passage communicating with the first sleeve;
  a second sleeve, integrated into the first sleeve to form an accommodating space communicating with the passage;
  a driven element, disposed in the accommodating space and comprising a guiding portion and an inserting rod, wherein the inserting rod is movably inserted in the passage along a first direction, and the guiding portion has a first inclined guiding surface forming a first acute angle with the first direction;
  a positioning element, comprising:
    a guide rod, movably inserted in the second sleeve along a second direction that forms a second acute angle with the first inclined guiding surface; and
    a slide block, connected to the guide rod and in sliding contact with the first inclined guiding surface; and
  an elastic element, disposed in the accommodating space and allowing the inserting rod axially inserted therein, wherein one end of the elastic element leans against the driven element, and the other end of the elastic element leans against the first sleeve;
  wherein a portion of the plug tube passes through the through hole from the first surface and clamped on the second surface;
  when the positioning element is pushed by an external force to drive the guide rod moving along the second direction in the second sleeve, the driven element is driven to move along the first direction, so as to make the inserting rod passing through the passage and entering into the insertion hole;
  when the external force is removed, the driven element is pushed by the elastic element to drive the guide rod in the second sleeve moving along a direction opposite to the second direction, so as to make the plunger moving along a direction opposite to the first direction and leaves the insertion hole.

11. The board-to-board assembled structure according to claim 10, wherein the second board is a movable part moving along a direction perpendicular to the first direction, and a portion of the inserting rod that enters into the insertion hole is used to stop the second board from moving along the direction.

12. The board-to-board assembled structure according to claim 10, wherein the first board and the second board are connected to each other through an interference contact between the inserting rod and the insertion hole.

13. The board-to-board assembled structure according to claim 10, wherein the second surface has a recess for accommodating a portion of the plug tube passing through the through hole.

14. The board-to-board assembled structure according to claim 10, wherein the first sleeve has at least one locking hole disposed at a bottom edge of the first sleeve, and the second sleeve has at least one hook protruding from an outer edge of the second sleeve adjacent to its sleeve opening, and correspondingly engaging with the at least one locking hole.

15. The board-to-board assembled structure according to claim 10, wherein a sum of the first acute angle and the second acute angle is 90°.

16. The board-to-board assembled structure according to claim 10, wherein the second sleeve has a first opening and a second opening aligned with each other along the second direction; and the guide rod movably passes through the first opening and the second opening.

17. The board-to-board assembled structure according to claim 16, wherein the positioning element further comprises a hook protruding from one end of the guide rod; when the guide rod moves along the second direction to drive the hook out of the first opening, the elastic element pushes the positioning element to make the hook buckled on an upper end of the first opening.

18. The board-to-board assembled structure according to claim 10, wherein the driven element further comprises a base having an upper surface and a lower surface opposite to the upper surface; the inserting rod protrudes from the lower surface; and the guiding portion protrudes from the upper surface, and the elastic member leans against the lower surface.

19. The board-to-board assembled structure according to claim 18, wherein the guiding portion comprises a first limiting portion and a second limiting portion both protruding on the upper surface and separated from each other; the first limiting portion has a first vertical wall; the second limiting portion has a second vertical wall facing the first vertical wall; and the guide rod is disposed between the first vertical wall and the second vertical wall.

20. The board-to-board assembled structure according to claim 19, wherein the first limiting portion comprises a first wedge-shaped convex portion protruding from a side opposite to the first vertical wall and the first inclined guiding surface disposed on the first wedge-shaped convex portion; and the second limiting portion comprises a second wedge-shaped convex portion protruding from a side opposite to the second vertical wall and comprising a second inclined guiding surface parallel to the first inclined guiding surface.

21. The board-to-board assembled structure according to claim 20, wherein the slide block further comprises:
- a first protruding rib, extending parallel to the guide rod and in sliding contact with the first inclined guiding surface to make the first limiting portion disposed between the guide rod and the first protruding rib; and
- a second protruding rib, extending parallel to the guide rod and in contact with the second inclined guiding surface to make the second limiting portion disposed between the guiding rod and the second protruding rib.

* * * * *